United States Patent
Xiao et al.

(10) Patent No.: US 10,822,513 B1
(45) Date of Patent: Nov. 3, 2020

(54) ELECTRICALLY CONDUCTIVE PTC SCREEN PRINTABLE INK COMPOSITION WITH LOW INRUSH CURRENT AND HIGH NTC ONSET TEMPERATURE

(71) Applicant: 1-Material Inc, Dorval (CA)

(72) Inventors: Shuyong Xiao, St-Laurent (CA); Qingli Liu, Montreal (CA)

(73) Assignee: 1-Material Inc, Dorval (CA)

( * ) Notice: Subject to any disclaimer, the term of this patent is extended or adjusted under 35 U.S.C. 154(b) by 0 days.

(21) Appl. No.: 16/395,594

(22) Filed: Apr. 26, 2019

(51) Int. Cl.
| | | |
|---|---|---|
| *C09D 11/52* | (2014.01) | |
| *H05B 3/12* | (2006.01) | |
| *H05K 1/09* | (2006.01) | |
| *C09D 11/033* | (2014.01) | |
| *C09D 11/037* | (2014.01) | |
| *C09D 11/104* | (2014.01) | |
| *C09D 11/106* | (2014.01) | |
| *H05B 3/10* | (2006.01) | |

(52) U.S. Cl.
CPC ............ *C09D 11/52* (2013.01); *C09D 11/033* (2013.01); *C09D 11/037* (2013.01); *C09D 11/104* (2013.01); *C09D 11/106* (2013.01); *H05B 3/10* (2013.01); *H05B 3/12* (2013.01); *H05K 1/09* (2013.01); *H05B 2203/02* (2013.01)

(58) Field of Classification Search
CPC . C09D 11/52; H05B 1/02; H05B 1/04; H05B 2203/02; H05B 3/10; H05K 1/09
USPC ............ 252/500, 502, 506, 510, 511, 519.33
See application file for complete search history.

(56) References Cited

U.S. PATENT DOCUMENTS

| | | |
|---|---|---|
| 4,628,187 A | 12/1986 | Sekiguchi et al. |
| 5,198,639 A | 3/1993 | Shafe et al. |
| 5,227,946 A | 7/1993 | Jacobs et al. |
| 5,344,591 A | 9/1994 | Smuckler et al. |
| 5,714,096 A | 2/1998 | Dorfman et al. |
| 5,985,182 A | 11/1999 | Zhao et al. |
| 8,496,854 B2 | 7/2013 | Mercx et al. |
| 9,573,438 B2 | 2/2017 | Dorfman et al. |
| 2013/0193384 A1 | 8/2013 | Dorfman |
| 2015/0361287 A1 | 12/2015 | Xiao et al. |
| 2017/0158898 A1* | 6/2017 | Xiao .................... C09D 11/106 |
| 2017/0327707 A1 | 11/2017 | Xiao et al. |

FOREIGN PATENT DOCUMENTS

| | | | | |
|---|---|---|---|---|
| CN | 101026029 | * | 8/2007 | ............ H01C 17/00 |
| EP | 0311142 | | 4/1989 | |
| JP | H11-310739 A | * | 11/1999 | ............ C09D 11/00 |
| JP | 2008293672 | | 12/2008 | |
| JP | 2009151976 | | 7/2009 | |
| JP | 2009199794 | | 9/2009 | |

* cited by examiner

Primary Examiner — Tri V Nguyen
(74) Attorney, Agent, or Firm — Stratford Managers Corporation

(57) ABSTRACT

An electrically conductive screen-printable PTC ink composition with low inrush current and high NTC onset temperature, consisting of at least two different polymers, polymer-1 and polymer-2; wherein the melting temperature difference between polymer-1 and polymer-2 must be greater than 50° C., and the mechanical strength of polymer-1 as expressed by Young's modulus must be greater than 200 MPa.

20 Claims, 9 Drawing Sheets

ELECTRICALLY CONDUCTIVE PTC SCREEN PRINTABLE INK COMPOSITION WITH LOW INRUSH CURRENT AND HIGH NTC ONSET TEMPERATURE

TECHNICAL FIELD

The present disclosure relates to an electrically conductive positive temperature coefficient of resistance (PTC) ink composition which has a low inrush current and a high NTC onset temperature, which relates to self-regulating heaters.

BACKGROUND

It is well known that polymers can be made electrically conductive by dispersing suitable amounts of conductive particles such as carbon black or fine metal particles. Only a small part of the above polymeric compositions exhibit positive temperature coefficient of resistance (PTC) behavior, which refers to materials that demonstrate a substantial increase in electric resistance when their temperature is raised. Such devices have been used in many applications, especially in the electronic industry, including for use as constant temperature heaters, over current regulators, thermal sensors, and low-power circuit protectors. A typical use is controlling the amount of current passing through a circuit using the temperature of a PTC element that forms part of the circuit.

The PTC effect is usually expressed by the ratio between the resistance at a given temperature, $R_T$, and the resistance at a reference temperature, usually 25° C., denoted $R_{25}$. This ratio is also designated as "TCR". A plot of TCR (i.e. $R_T/R_{25}$) vs. temperature is often referred to as the PTC profile of a given PTC material as illustrated in FIG. 1. FIG. 1 shows two characteristic temperatures: one is referred to as the switch temperature, $T_s$, where the resistance increases dramatically with temperature, the other is referred to as the maximum temperature, $T_{max}$, where resistance reaches the maximum value. Beyond this $T_{max}$ point the electric resistance of the material decreases with increasing temperature, so called Negative Temperature Coefficient (NTC) behavior.

The performance of a PTC self-regulating heater is practically described by three characteristics. First, the resistance ratio at the switch temperature, $R_s/R_{25}$, where $R_s$ is the resistance at the switch temperature, $T_s$, and $R_{25}$ is the resistance at the reference temperature, 25° C. $R_s/R_{25}$ is critical for self-regulation to avoid any local overheating (hot spot) and to maintain the equilibrium temperature.

Second, the resistance ratio at the maximum temperature, $R_{max}/R_{25}$, where $R_{max}$ is the resistance at the maximum temperature, $T_{max}$, and $R_{25}$ is the reference resistance at 25° C. $R_{max}/R_{25}$ is critical for safety to avoid any self-burning (suicide) and to define the safety temperature range.

Third, the inrush current as illustrated in FIG. 2 is defined as the electric current created when the voltage, V, is immediately/initially applied (time at zero in FIG. 3). Mathematically, the inrush current is calculated by the applied voltage, V, and the initial resistance, $R_i$, of the heater, that is $I_{inrush}=V/R_i$. To better express the inrush impact, an inrush impact factor is defined as a ratio between the inrush current and the current at the switch temperature, i.e., $I_{inrush}/I_s$, wherein $I_{inrush}$ is the current when power is on, and $I_s$ is the current at the switch temperature, which mathematically equals to the ratio of $R_s/R_i$ when the voltage is constant, where $R_s$ is the resistance at the switch temperature and $R_i$ is the initial resistance at power on.

An initial fast heat-up is normally viewed as an advantage for a PTC film heater compared to a non-PTC heater where the resistance does not change substantially with variation of temperature, so the temperature can quickly reach the desired point. However, if the starting temperature is very low, as in the case of the external surface of an aircraft flying at high altitude, the starting resistance, $R_i$, of the heater may be too low, and in return, this may draw a high inrush current from the power source. Consequently, this may overpower the electric circuit and shut down the system. Therefore, the inrush current should also be properly controlled in such a circumstance by designing a PTC composition that does not exhibit a significant PTC effect in cold temperatures.

Various PTC compositions have been disclosed, such as U.S. Pat. Nos. 9,573,438, 5,344,591, 5,985,182, and US patent application 20130193384A1. However, it is still hard to find a practical PTC ink with a good balance of the three characteristics listed above. Particularly, a variety of techniques have been created to reduce or eliminate the dangerous NTC effect. As disclosed in U.S. Pat. No. 5,227,946 and European Patent EP 0311142, reduction of the NTC effect can be achieved by cross-linking polymeric PTC compositions. Most effective is post cross-linking after the forming step either by gamma radiation or accelerated electrons. Cross-linking in the melt also erases the NTC effect but negatively affects the PTC amplitude. In addition, the step of cross-linking the material increases the time and production costs for manufacturing the PTC composition.

A dramatic resistance increase at the switch temperature is required to realize the self-regulating feature of a given PTC heater, ideally an ON-OFF switching at the designed equilibrium temperature. However, in most polymeric PTC compositions, there is only one kind of polymer as the vehicle. When the temperature is above the melting point, $T_m$, or softening point, $T_s$, of the polymer, the polymeric PTC composition will turn unstable, which usually results in NTC behaviour.

It is advantageous to develop a PTC ink with a desirable switch temperature while extending NTC onset as far as possible from the desirable switch temperature, technically to have a maximum value of $T_{max}-T_s$ as shown in a typical PTC profile of FIG. 1. Another objective of this invention is to achieve a low inrush PTC composition without compromising the desired PTC effect at the switch temperature.

SUMMARY

The present disclosure provides a method to keep inrush current low and eliminate or much delay the NTC effect of the PTC composition.

In one aspect, there is provided a positive temperature coefficient (PTC) composition comprising: 5-35 wt % of a first polymer; 1-20 wt % of a second polymer; 5-50 wt % of a conductive particulate agent; and 30-80 wt % of an organic solvent; wherein: the first polymer has a melting temperature that is at least 50° C. higher than a melting temperature of the second polymer; the first polymer has a Young's modulus greater than 200 MPa; and the organic solvent dissolves both the first and second polymers.

The organic solvent may be selected from the group consisting of DBE-9, MEK, NMP, toluene, xylene and any mixture thereof. Furthermore, the second polymer can be selected from a crystalline polymer or semi-crystalline polymer. Furthermore, the second polymer may have a melting temperature below 90° C., or below 80° C., or between 40-70° C. In addition, the melting temperature of the first polymer may be above 120° C., or above 140° C. Furthermore, the Young's modulus of the first polymer can be greater than 500 MPa.

The conductive particulate agent can be selected from the group consisting of metallic powder, metal oxide, carbon black and graphite. In some embodiments, the conductive particulate agent may be carbon black, or low-structured carbon black.

In another aspect, there is provided a film comprising the above positive temperature coefficient (PTC) composition, wherein the composition has a low inrush current impact and a high NTC onset temperature beyond a switching temperature. In some embodiments of the film, the second polymer can be selected from a crystalline polymer or semi-crystalline polymer; the second polymer having a melting temperature below 90° C. Furthermore, in some embodiments of the film, the melting temperature of the first polymer can be above 120° C., while the conductive particulate agent can be selected from the group consisting of metallic powder, metal oxide, carbon black and graphite.

In another aspect, there is provided a heater comprising the above positive temperature coefficient (PTC) composition, wherein the composition has a low inrush current impact and a high NTC onset temperature beyond a switching temperature. In some embodiments of the heater, the second polymer can be selected from a crystalline polymer or semi-crystalline polymer; the second polymer having a melting temperature below 90° C. Furthermore, in some embodiments of the heater, the melting temperature of the first polymer can be above 120° C., while the conductive particulate agent can be selected from the group consisting of metallic powder, metal oxide, carbon black and graphite.

The present disclosure is further directed to PTC circuits comprising the composition described above which has been dried to remove the solvent; a process for the preparation of such PTC circuits; and electrical devices containing such PTC circuits.

Additional features and advantages are realized through the techniques of the composition and method of making the same. Other embodiments and aspects of the composition and method of making the same are described in detail herein.

The recitation herein of desirable embodiments is not meant to imply or suggest that any or all of these embodiments are present as essential features, either individually or collectively, in the most general embodiment of the composition or method of making the same; or in any of its more specific embodiments.

BRIEF DESCRIPTION OF THE DRAWINGS

The foregoing and other advantages of the disclosure will become apparent upon reading the following detailed description and upon reference to the drawings.

Figure 1:
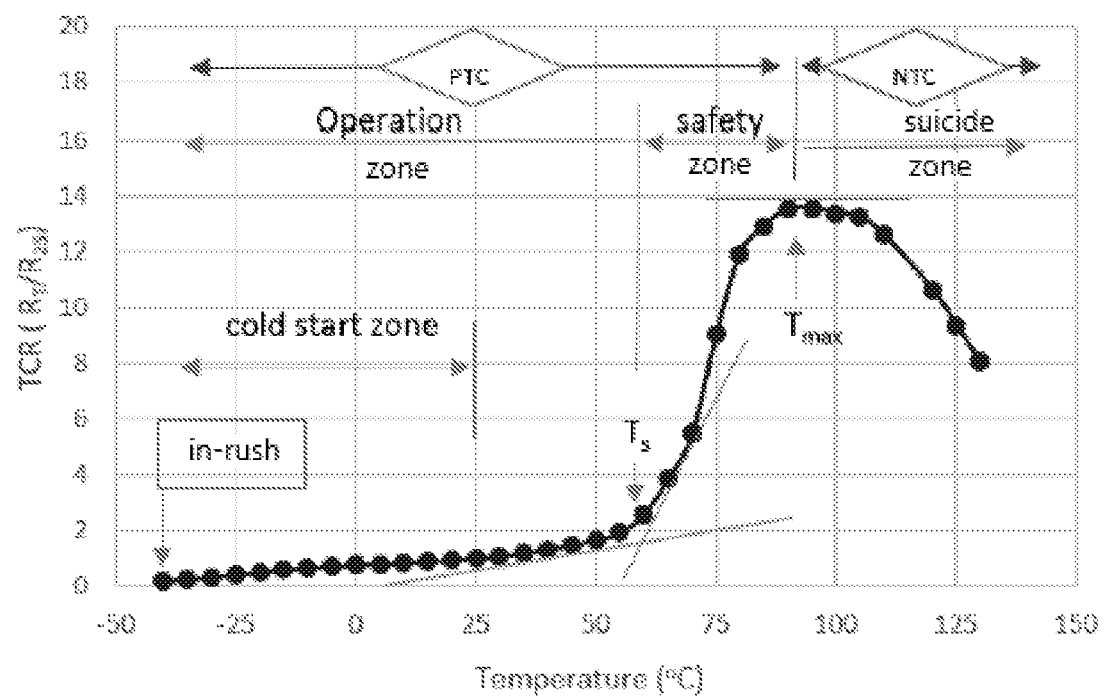
FIG. 1 illustrates a typical PTC profile (TCR vs temperature)
Figure 2:
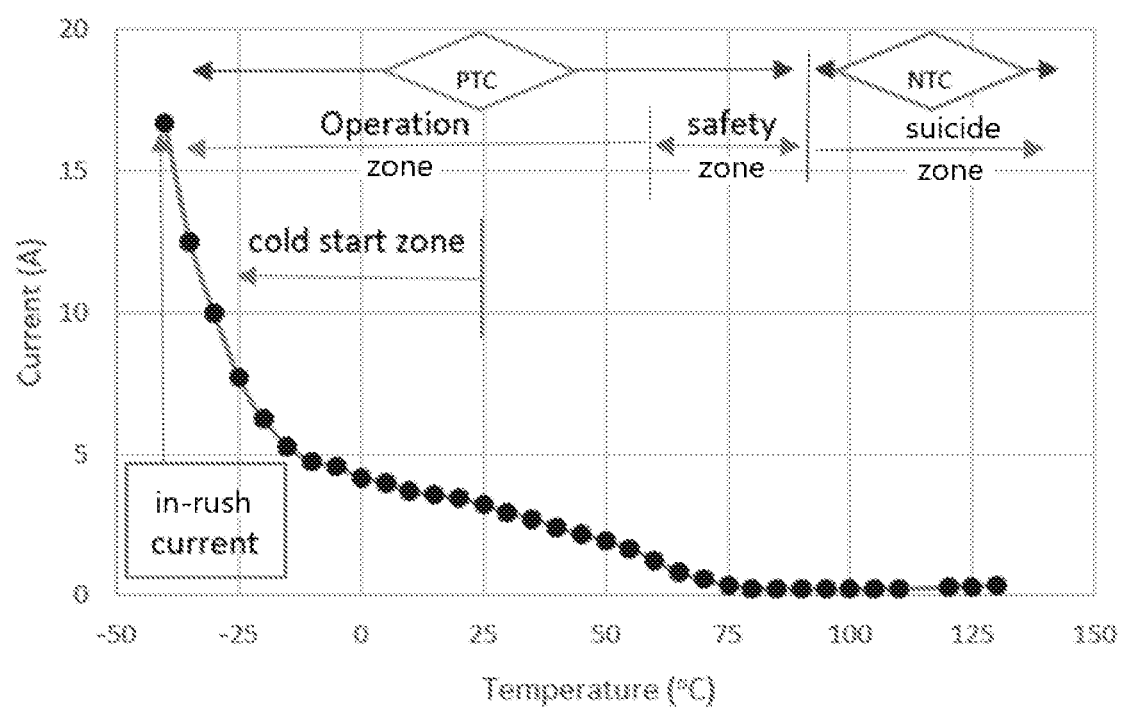
FIG. 2 illustrates a current vs temperature profile of a typical PTC heater.
Figure 3:
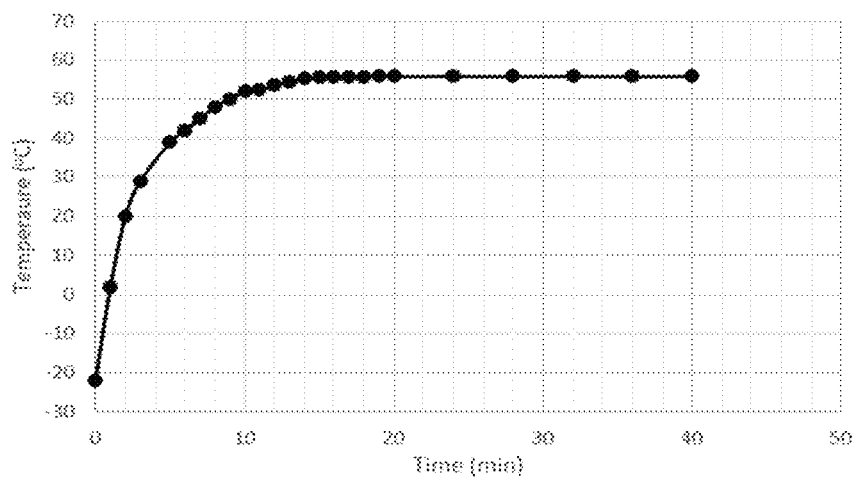
FIG. 3 illustrates a temperature vs time profile of a typical PTC heater.
Figure 4:
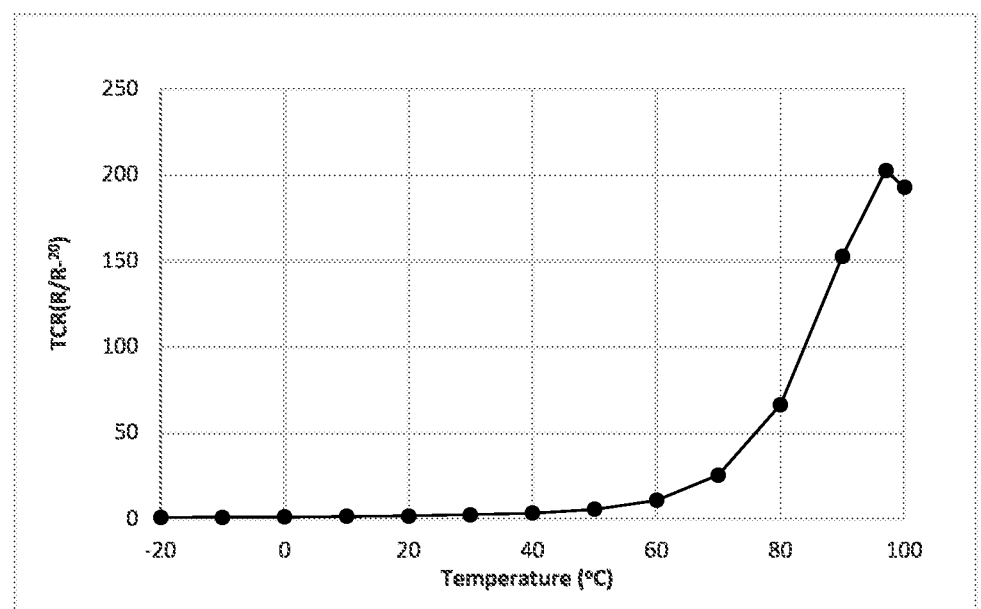
FIG. 4 illustrates a PTC profile of an embodiment.
Figure 5:
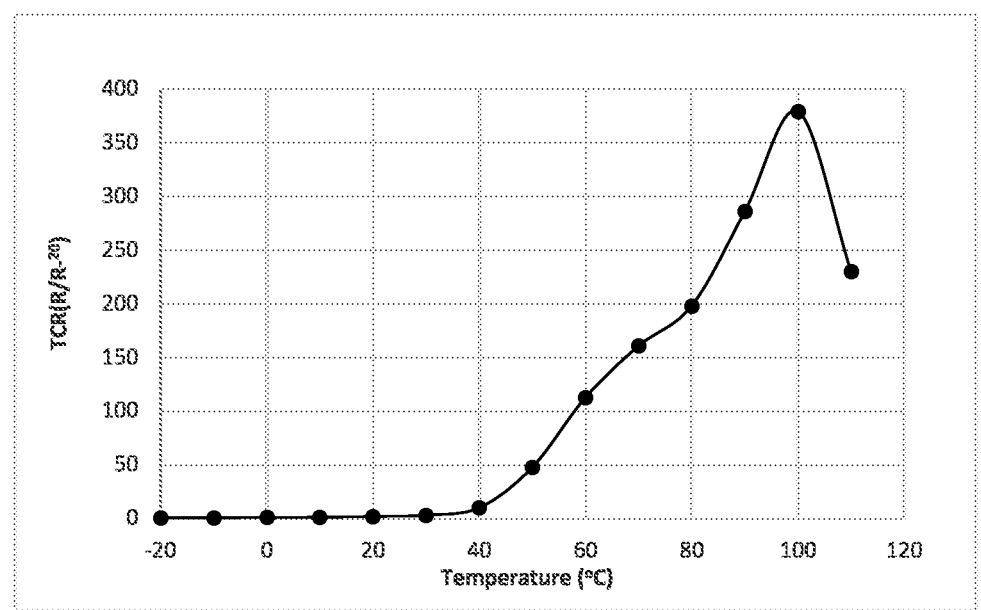
FIG. 5 illustrates a PTC profile of an embodiment.
Figure 6:
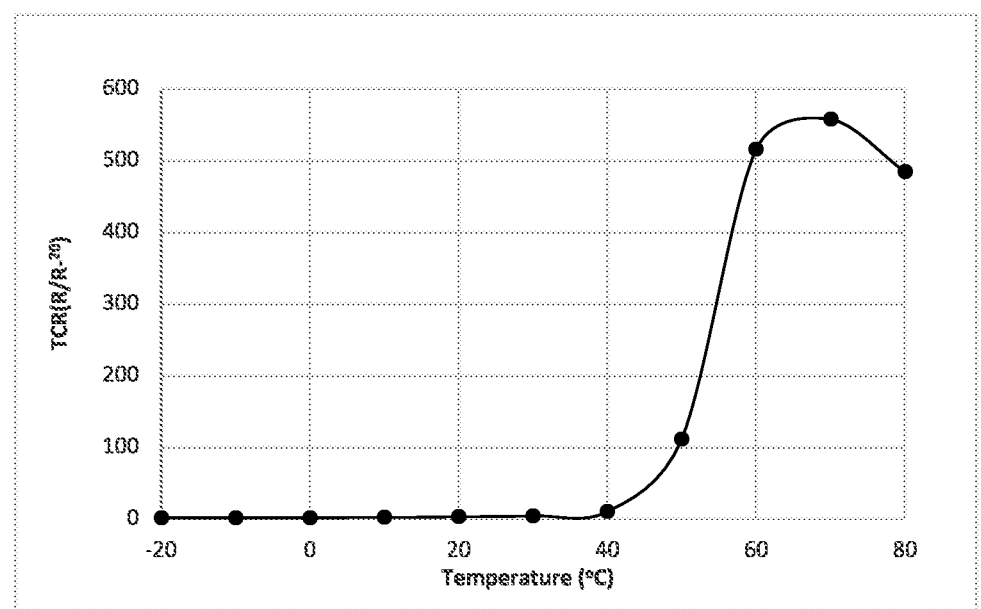
FIG. 6 illustrates a PTC profile of an embodiment.
Figure 7:
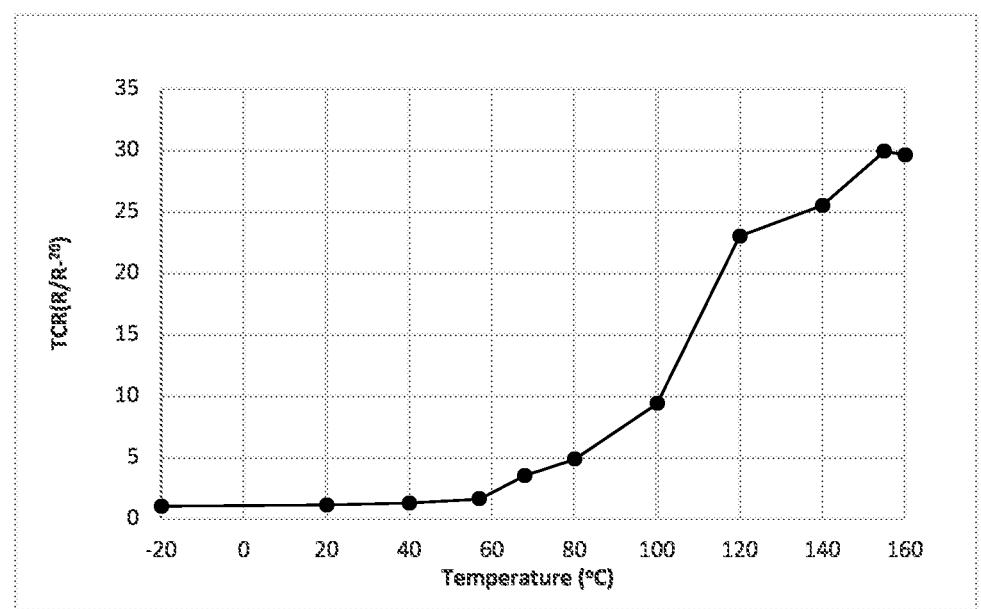
FIG. 7 illustrates a PTC profile of an embodiment.
Figure 8:
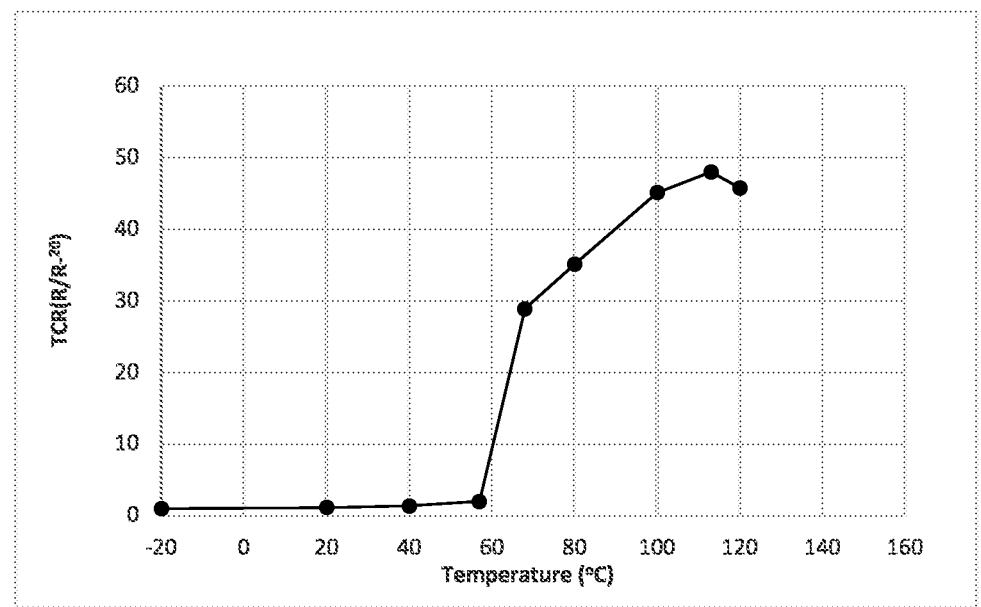
FIG. 8 illustrates a PTC profile of an embodiment.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

The present disclosure provides an electrically conductive PTC screen-printable ink composition with low inrush current and high NTC onset temperature and a method of making the same. The electrically conductive PTC ink composition presents both an efficient PTC effect at the switch temperature and maintains PTC effect beyond the switching temperature for a wide temperature range. When the present PTC ink composition is applied in a self-regulating heating element, it offers a low inrush current, a desirable regulated temperature, and a wider safety operation temperature range.

In an embodiment, the PTC ink composition comprises at least two polymers, referred to as a first polymer (polymer-1) and a second polymer (polymer-2). The selection of the two polymers meet two criteria at the same time. The first criterion is that the difference in melting temperatures between the two polymers is greater than 50° C. The second criterion is that the Young's modulus of at least one of the two polymers is greater than 200 MPa.

For convenience, we refer the polymer with higher melting temperature as polymer-1 herein, and the polymer with lower melting temperature as polymer-2. Accordingly, the switch temperature is mainly determined by the melting temperature of polymer-2, which may be selected from crystalline or semi-crystalline polymers with a melting temperature below 90° C., or below 80° C., or between 40-70° C.

Accordingly, the structural strength of the PTC composition is provided by polymer-1. Therefore, the selected polymer-1 has a higher melting temperature (than polymer-2) and higher mechanical strength as expressed by a higher Young's modulus. To reduce or even eliminate the NTC effect, the melting temperature of polymer-1 can be at least 50° C. above the melting temperature of the selected polymer-2, thus, the melting temperature of polymer-1 can be above 120° C., or above 140° C. To reduce the inrush current and hold the PTC composition in place over the whole operating temperature range, the Young's modulus of polymer-1 can be greater than 200 MPa, or greater than 500 MPa.

The selection of polymer-2 is mainly according to the requirement of the equilibrium temperature. The melting temperature of polymer-2 can be close to the equilibrium temperature required. And polymer-2 can have good adaptability with polymer-1. There is no requirement for polymer-2's Young's modulus.

The selection of the solvent is based on its proper boiling point and the solubility of polymer resins used. All the polymers are completely dissolved in the organic vehicle prior to blending with other components. Any organic, inert liquid may be used as the solvent for the medium (vehicle) so long as the polymers are fully solubilized.

Solvents may be selected from DBE-9, MEK, N-methyl-2-pyrrolidone (NMP), toluene, xylene, and the like. In one embodiment, the solvent used is the mixture of DBE-9 and NMP, which has a greater viscosity stability than each of them alone.

Some conductive particles may be added to this PTC ink composition to provide electrically conductive function. The conductive particles can be one or a mixture of more than one of metallic powder, metal oxide, carbon black and graphite. The conductive particles may be carbon black, or a low-structured carbon black.

In an embodiment, a positive temperature coefficient (PTC) composition comprises two different polymers: polymer-1 and polymer-2; where the melting temperature of polymer-1 is at least 50° C. higher than that of polymer-2, and the Young's modulus of polymer-1 is larger than 200 MPa. The composition comprises:
 a) 5-35 wt % polymer-1;
 b) 1-20 wt % polymer-2;
 c) 5-50 wt % carbon black;
 d) 30-80 wt % organic solvent for dissolving both polymer-1and polymer-2.

The PTC ink composition may be prepared according to the procedure consisting of the following steps: 1) the preparation of 5-55 wt. % polymer solution by dissolving the selected polymer-1 and polymer-2 in the selected solvent; 2) the preparation of an ink base by adding pre-calculated carbon black into the polymer solution; and 3) the preparation of final PTC ink composition by adding a proper amount of polymer solution into the ink base to adjust the ratio between carbon black and polymer so as to fine-tune electric resistance of the final PTC composition.

The resulting PTC ink composition may be applied to substrates such as polyester films, e.g. DuPont® Teijin films, by a screen-printing process. After printing the PTC ink on a polyester film, it is cured in an oven at 120° C. for 10 minutes. Subsequently, a conductive paste suitable for use on polyester substrates such as DuPont® 5025 silver paste is printed over edges of the PTC ink and cured at 120° C. for 5 minutes. The cured film is then tested for resistance change with temperature. The resistance of the cured PTC film is measured as a function of temperature, so the PTC characteristics are determined.

The composition will now be described in more detail with reference to the following examples. However, these examples are given for illustration only and are not intended to limit the scope of the present invention.

EXAMPLES

In all these examples, all parts and percentages are by weight unless otherwise noted. Of these examples, polyvinylidene fluoride (PVDF) resins are purchased from Arkema USA, Poly(ε-caprolactone) diester with neopentyl glycol resins(CAPA) are purchased from Perstorp Sweden; Polyacrylate based intelimer polymer resins (IPA) are purchased from Air Products USA, Carbon Black is purchased from Cabot USA, and all other chemicals are purchased from Sigma-Aldrich Company USA unless otherwise specified.

Table-1 summarizes some physical properties of polymer resins used in preparing examples. Table-1, Physical properties of selected polymers

| Commercial grade | Chemical family | Melting temperature (° C.) | Young's modulus (MPa) |
|---|---|---|---|
| Flex | PVDF | 100 | 80 |
| KY2800 | PVDF | 140 | 550-900 |

-continued

| Commercial grade | Chemical family | Melting temperature (° C.) | Young's modulus (MPa) |
|---|---|---|---|
| PL1000 | CAPA | 35 | NA* |
| PL6100 | CAPA | 59 | NA* |
| IPA13 | Intelimer | 65 | NA* |

NA* Not Available

General procedure to prepare PTC inks: PTC inks exampled hereafter are prepared according to a general procedure as described below. First, a polymer solution is prepared by dissolving the selected polymer-1 and polymer-2 in a solvent mixture containing 50% of DBE-9 and 50% of NMP, where the ratios between the two polymers are given in each individual example. The overall concentration of polymer solution is controlled at 25%, and the dissolution of polymers is completed by stirring at 80° C. for 2 hours. Second, an ink master base is prepared by adding the conductive carbon black into the polymer solution and mixing for 30 minutes and then passing through a three-roll mill three times until all the carbon black particles in the mixture are less than 10 μm. Finally, the final ink is completely letdown by mixing a certain amount of the polymer solution with the master ink base to adjust the viscosity and sheet resistance of the final PTC ink.

General procedure to evaluate a PTC ink: To evaluate the PTC inks prepared in these examples, film strips with silver contacts on both ends of the film strips are first prepared as detailed hereafter. DuPont® 5025 silver conductive ink is first printed on a polyester substrate, e.g. MELINEX ST505, commercially available from TEKRA USA, to create two silver lines, and then dried at 120° C. for 5 minutes in a box oven to create silver contacts. The PTC film strips are then constructed between these silver contacts by over-printing the exampled PTC ink and dried at 120° C. for 10 minutes in a box oven. Both silver paste and PTC ink are printed by a 280-mesh plastic screen. Thickness of silver contacts is about 20 μm while the thickness of the PTC film strip is about 7 μm, as measured by a calibrated micrometer screw gauge. The sheet resistances at different temperatures in a temperature controlled oven is precisely measured by an HP multimeter. With measured resistances at different temperatures, a PTC profile as illustrated in FIG. 1 is plotted. From this plotted PTC profile, typical points such as the switch temperature, $T_s$, and the maximum temperature, $T_{max}$, are found.

Table 2 summarizes the polymers selected in preparing samples exampled including the ratio between two polymers and associated physical properties.

TABLE-2

Exampled sample summary

| Example No. | Polymer-1 (P1) | Polymer-2 (P2) | Ratio (P1/P2) | P1 Young's modulus (MPa) | Melting temperature difference(P1-P2) (° C.) |
|---|---|---|---|---|---|
| 1 | Flex | PL1000 | 2 | 80 | 65 |
| 2 | Flex | PL6100 | 2 | 80 | 41 |
| 3 | Flex | PL6100 | 1 | 80 | 41 |
| 4 | KY2800 | IPA13 | 1 | 550-900 | 75 |
| 5 | KY2800 | IPA13 | 0.5 | 550-900 | 75 |
| 6 | KY2800 | NA | NA | 550-900 | NA |

In order to better demonstrate the inrush impact in a cool environment, a reference temperature of minus 20 degree Celsius (−20° C.) was selected to plot the TCR vs temperature for the examples listed in Table 2. So the inrush impact can be expressed by $R_{Ts}/R_{-20° C.}$. FIGS. 4-9 presents PTC profiles of these examples 1-6 respectively.

TABLE 3

PTC Performance of listed examples

| Example | $T_s$ (° C.) | $T_{max}$ (° C.) | $T_{max}- T_s$ (° C.) | $R_{Ts}/R_{-20° C.}$ |
|---|---|---|---|---|
| 1 | 70 | 97 | 27 | 27.0 |
| 2 | 40 | 100 | 60 | 10.1 |
| 3 | 48 | 70 | 22 | 110 |
| 4 | 57 | 155 | 98 | 1.6 |
| 5 | 57 | 113 | 56 | 1.9 |
| 6 | 105 | 137 | 32 | 8.7 |

From FIG. 4-9 and Table 3, it is clearly seen that Example 1 has a very low $T_{max}-T_s$ (° C.) implying an NTC onset is close to the switching temperature, and a high $R_{Ts}/R_{-20° C.}$ implying a high inrush impact, which failed due to the low Young's modulus of polymer-1. Example 2 exhibits a high $T_{max}-T_s$ (° C.) implying its NTC onset is significantly postponed beyond the switching temperature but has a high $R_{Ts}/R_{-20° C.}$ implying a high inrush impact, which also failed due to the low Young's modulus of polymer-1. Like Example 1, Example 3 has a very low $T_{max}-T_s$ (° C.) implying an NTC onset is close to the switching temperature, and a high $R_{Ts}/R_{-20° C.}$ implying a high inrush impact, which failed due to the low Young's modulus of polymer-1 and the small melting temperature difference between the polymer 1 and polymer-2.

Comparing Examples 1-3, Examples 4-5 deliver the desired performance, including both the low inrush impact as expressed by a low value of $R_{Ts}/R_{-20° C.}$ and the wide safety temperature range beyond the switching temperature as expressed by a value of $T_{max}-T_s$ (° C.). In both examples, polymer-1 has a Young's Modulus greater than 500 MPa, and the melting temperature difference between polymer-1 and polymer-2 is greater than 50° C.

Figure 9:
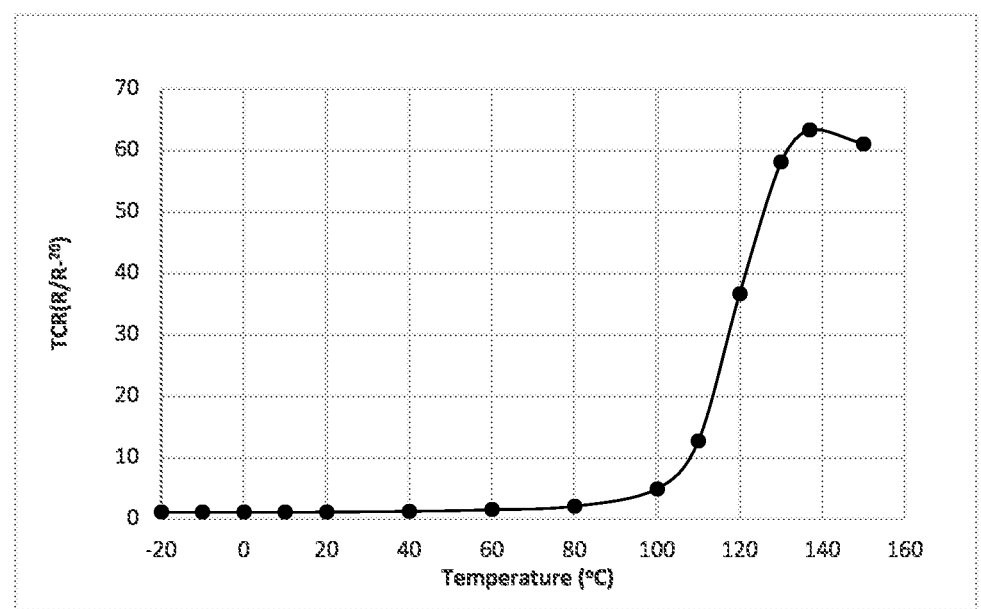
FIG. 9 illustrates a PTC profile of an embodiment.

In example 6, there is only polymer-1, no polymer-2. FIG. 9 shows both characteristics are not good: $T_{max}-T_s$ is too small (32° C.), $R_{Ts}/R_{-20° C.}$ is too large (8.7). This example shows the importance of the selection of polymer-2.

While particular implementations and applications of the present disclosure have been illustrated and described, it is to be understood that the present disclosure is not limited to the precise construction disclosed herein and that various modifications, changes, and variations can be apparent from the foregoing descriptions without departing from the spirit and scope of an invention as defined in the appended claims.

What is claimed is:

1. A positive temperature coefficient (PTC) composition comprising:
   5-35 wt % of a first polymer;
   1-20 wt % of a second polymer;
   5-50 wt % of a conductive particulate agent; and
   30-80 wt % of an organic solvent;
   wherein:
   the first polymer has a melting temperature that is at least 50° C. higher than a melting temperature of the second polymer;
   the first polymer has a Young's modulus between 200 MPa and 900 MPa; and
   the organic solvent dissolves both the first and second polymers.

2. The composition of claim 1, wherein the organic solvent is selected from the group consisting of DBE-9, MEK, NMP, toluene, xylene and any mixture thereof.

3. The composition of claim 1, wherein the second polymer is selected from a crystalline polymer or semi-crystalline polymer.

4. The composition of claim 3, wherein the second polymer has a melting temperature below 90° C.

5. The composition of claim 4, wherein the second polymer has a melting temperature below 80° C.

6. The composition of claim 3, wherein the second polymer has a melting temperature between 40-70° C.

7. The composition of claim 1, wherein the melting temperature of the first polymer is above 120° C.

8. The composition of claim 7, wherein the melting temperature of the first polymer is above 140° C.

9. The composition of claim 1, wherein the Young's modulus of the first polymer is between 500 MPa and 900 MPa.

10. The composition of claim 1, wherein the conductive particulate agent is selected from the group consisting of metallic powder, metal oxide, carbon black and graphite.

11. The composition of claim 10, wherein the conductive particulate agent is carbon black.

12. The composition of claim 10, wherein the conductive particulate agent is low-structured carbon black.

13. A film comprising the composition of claim 1, wherein the composition has a low inrush current impact and a high NTC onset temperature beyond a switching temperature.

14. The film of claim 13, wherein the second polymer is selected from a crystalline polymer or semi-crystalline polymer; the second polymer having a melting temperature below 90° C.

15. The film of claim 13, wherein the melting temperature of the first polymer is above 120° C.

16. The film of claim 13, wherein the conductive particulate agent is selected from the group consisting of metallic powder, metal oxide, carbon black and graphite.

17. An electric heater comprising the composition of claim 1, wherein the composition has a low inrush current impact and a high NTC onset temperature beyond a switching temperature.

18. The heater of claim 17, wherein the second polymer is selected from a crystalline polymer or semi-crystalline polymer; the second polymer having a melting temperature below 90° C.

19. The heater of claim 17, wherein the melting temperature of the first polymer is above 120° C.

20. The heater of claim 17, wherein the conductive particulate agent is selected from the group consisting of metallic powder, metal oxide, carbon black and graphite.

* * * * *